United States Patent [19]

Uratsuji

[11] Patent Number: 5,199,883
[45] Date of Patent: Apr. 6, 1993

[54] MOUNT-TO-CONTACT TYPE CONTACT

[75] Inventor: Kazumi Uratsuji, Tokyo, Japan

[73] Assignee: Yamaichi Electric Co., Ltd., Tokyo, Japan

[21] Appl. No.: 849,663

[22] Filed: Mar. 10, 1992

[30] Foreign Application Priority Data

Mar. 15, 1991 [JP] Japan .................................. 3-75863

[51] Int. Cl.$^5$ ............................................... H01R 9/09
[52] U.S. Cl. ........................................ 439/72; 439/70; 439/525
[58] Field of Search ................ 439/70, 72, 73, 80, 439/81, 330, 525, 526

[56] References Cited

U.S. PATENT DOCUMENTS

| 4,715,823 | 12/1987 | Ezura et al. | 439/70 |
| 4,824,389 | 4/1989 | Doyle et al. | 439/72 |
| 4,846,704 | 7/1989 | Ikeya | 439/72 |
| 4,936,783 | 6/1990 | Petersen | 439/70 |
| 4,936,784 | 6/1990 | Saito | 439/70 |
| 4,940,432 | 7/1990 | Consoli et al. | 439/72 |
| 4,941,832 | 7/1990 | Korsunsky et al. | 439/72 |
| 4,995,817 | 2/1991 | Grabbe | 439/70 |
| 4,997,378 | 3/1991 | Matsuoka et al. | 439/72 |
| 5,018,981 | 5/1991 | Matsuoka | 439/72 |
| 5,035,629 | 7/1991 | Matsuoka | 439/72 |

FOREIGN PATENT DOCUMENTS

| 63-164191 | 10/1988 | Japan . | |
| 0087492 | 3/1990 | Japan | 439/72 |
| 3-17979 | 1/1991 | Japan . | |

Primary Examiner—Paula A. Bradley
Attorney, Agent, or Firm—Wenderoth, Lind & Ponack

[57] ABSTRACT

A mount-to-contact type contact has a stationary terminal 1, a swinging contact element 3 swingably supported by the stationary terminal 1, and a spring 10 adapted to resiliently hold one swinging end 7 of the swinging contact element 3, the other swinging end 8 serving as a contact end on which a terminal 9 of an electric part 6 is to be mounted to achieve a contact relation.

5 Claims, 4 Drawing Sheets

MOUNT-TO-CONTACT TYPE CONTACT

BACKGROUND OF THE INVENTION

1. Field of the Invention

This invention relates to a mount-to-contact type contact on which a terminal of an electric part such as an IC is to be mounted to realize a contact relation therebetween.

2. Brief Description of the Prior Art

In general, a mount-to-contact type contact has a stationary terminal, and a horizontal U-shaped spring portion extending from one end of the stationary terminal, a terminal of an electric part being mounted on a free end of the horizontal U-shaped spring portion to flex the spring portion so that contact pressure can be obtained by reaction thereof.

However, the above-mentioned contact has the shortcomings that since an electric signal flows from the free end of the horizontal U-shaped spring portion to the stationary terminal portion via the horizontal U-shaped spring portion, the path length becomes long, and its characteristics are deteriorated with respect to a high frequency signal.

As one means for obviating the above shortcomings, the present applicant has developed an improved contact which, as shown in Japanese Patent Early Laid-open Publication No. Hei 3-17979 (corresponding to U.S. Pat. No. 5,018,981), has a bypass element disposed at an internal area of the horizontal U-shaped spring portion, one end of the bypass element being in contact with an area in the vicinity of the free end of the horizontal U-shaped spring portion and the other end thereof being in contact with an area of connection between the stationary terminal and the horizontal U-shaped spring portion, a signal being bypassed from the free end of the horizontal U-shaped spring portion to the stationary terminal portion through the bypass element, thus shortening the path length.

Also, in Japanese Utility Model Early Laid-open Publication No. Sho 63-164191, a contact has a shortening projection piece projecting from an upper end of a stationary terminal, and upon downward flexure, a horizontal U-shaped spring portion contacts this projecting piece to form a bypass.

The above contact is effective in shortening the signal path length. However, it has the shortcomings that when the free end of the horizontal U-shaped spring portion is pushed down (in the example wherein the bypass element is provided as mentioned above), a high load is incurred because the spring force of the horizontal U-shaped spring portion and spring force of the bypass element are applied with a multiplier effect, and hazardous contact resistance is increased in view of its characteristics because at least three contact points are formed in the bypass when a signal flows through the bypass element.

In the latter example having the shortening projection piece, downward displacement of the horizontal U-shaped spring portion is restricted by the projection piece, and further push-down force is applied after the horizontal U-shaped spring portion hits the projection piece. Therefore, the terminal of the electric part and the contact are damaged. Moreover, the horizontal U-shaped spring portion is sometimes shifted from a correct position when it is displaced downward and is, therefore, not correctly abutted against the projection piece.

SUMMARY OF THE INVENTION

It is therefore a general object of the present invention to provide a mount-to-contact type contact capable of obviating the above-mentioned shortcomings.

A specific object of the present invention is to provide a mount-to-contact type contact, in which a signal path to leading to a terminal of an electric part is shortened, and a highly reliable contact can be obtained with reduced operating force.

In all of the above-mentioned conventional mount-to-contact type contacts, the free end of the horizontal U-shaped spring portion is commonly used as a contacting end on which an electric part is to be mounted to realize a contact relation. In other words, a contact portion, on which a terminal of an electric part is to be mounted to realize a contact relation, functions as spring means for obtaining a sufficient contact pressure.

On the other hand, a mount-to-contact type contact according to the present invention has a contact element on which a terminal of an electric part such as IC is to be mounted to realize a contact relation and which is formed as a separate body from a stationary terminal which is to be connected to a wiring board, etc. and a spring portion for obtaining a contact pressure, a swinging contact element being used as the contact element, the swinging contact element being swingably supported by the stationary terminal, one swinging end of the swinging contact element serving as a contact end on which the terminal of the electric part is to be mounted to realize a contact relation, the other swinging end of the swinging contact element being resiliently held by a spring in one swinging direction, the terminal of the electric part being mounted on the one swinging end of the swinging contact element to cause the swinging contact element to be swung in the other swinging direction against the spring, a contact relation being obtained between the swinging contact element and the terminal of the electric part by reaction of the biased spring, a signal path being formed between the terminal of the electric part and the stationary terminal through the swinging contact element.

The spring is designed such that it extends from the stationary terminal or it is formed as a separate body from both the stationary terminal and swinging contact element.

As mentioned above, the swinging contact element is supported on the stationary terminal and swingable about a fulcrum in one and the other swinging directions. One swinging end of the swinging contact element is resiliently held by the spring, and the terminal of the electric part is mounted on the other swinging end to realize a contact relation. The swinging contact element, as a lever, is swung in one or the other direction depending on a relative relation of force between the swinging end on the side of the electric part and the swinging end on the spring side. Accordingly, by swinging the swinging end on the electric part side against the spring, resilient force is accumulated in the spring and a contact pressure is obtained by its reaction between the terminal of the electric part and the swinging contact element.

When one swinging end of the swinging contact element is biased in one swinging direction by the spring, the swinging contact element functions as a lever on one hand and is brought into pressure contact with the terminal of the electric part at the other swinging end on the other hand. Similarly, when the terminal of the electric part is mounted on the other swinging end of the swinging contact element to swing the swinging contact element in the other swinging direction, the swinging element functions as a lever on one hand and causes the spring to be biased against resiliency thereof so that resilient force is accumulated in the spring.

As a result of the above-described function, the terminal of the electric part comes into contact with the swinging end of the swinging contact element, and the swinging contact element comes into contact with the stationary terminal at a swinging fulcrum portion thereof. Accordingly, the terminal of the electric part is connected to the stationary terminal through a shortest distance from the swinging contact element to the fulcrum, thereby effectively achieving the object of shortening the signal path. On the other hand, the spring can be given a proper length and spring constant in view of contact pressure and operability and without restriction of the path length. Furthermore, the spring can be displaced against resiliency with reduced force by the effect of lever of the swinging contact element. This feature along with the previously mentioned features make it possible to improve operability.

In addition, the number of contact points in the signal path between the terminal of the electric part and the stationary terminal can be minimized to two; the swinging end and fulcrum of the swinging contact element, and the spring force effectively acts on each contact point by the lever, thus enabling to provide high reliability.

DETAILED DESCRIPTION OF THE EMBODIMENT

Several preferred embodiments of the present invention will be described in detail with reference to FIGS. 1 through 8 of the accompanying drawing.

Figure 1:
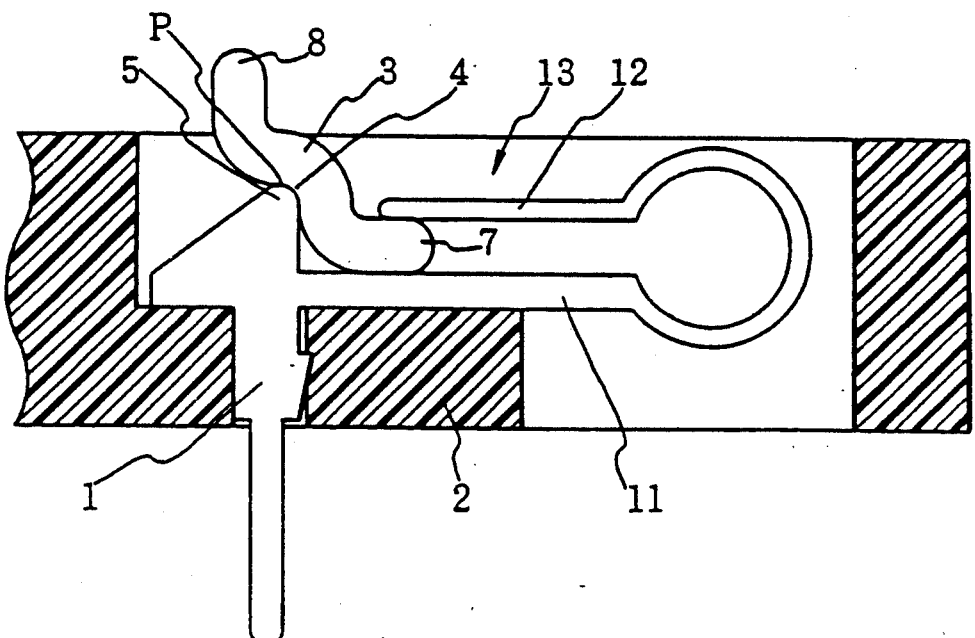
FIG. 1 is a side sectional view showing a mount-to-contact type contact according to a first embodiment of the present invention, which is implanted in a socket board.
Figure 2:
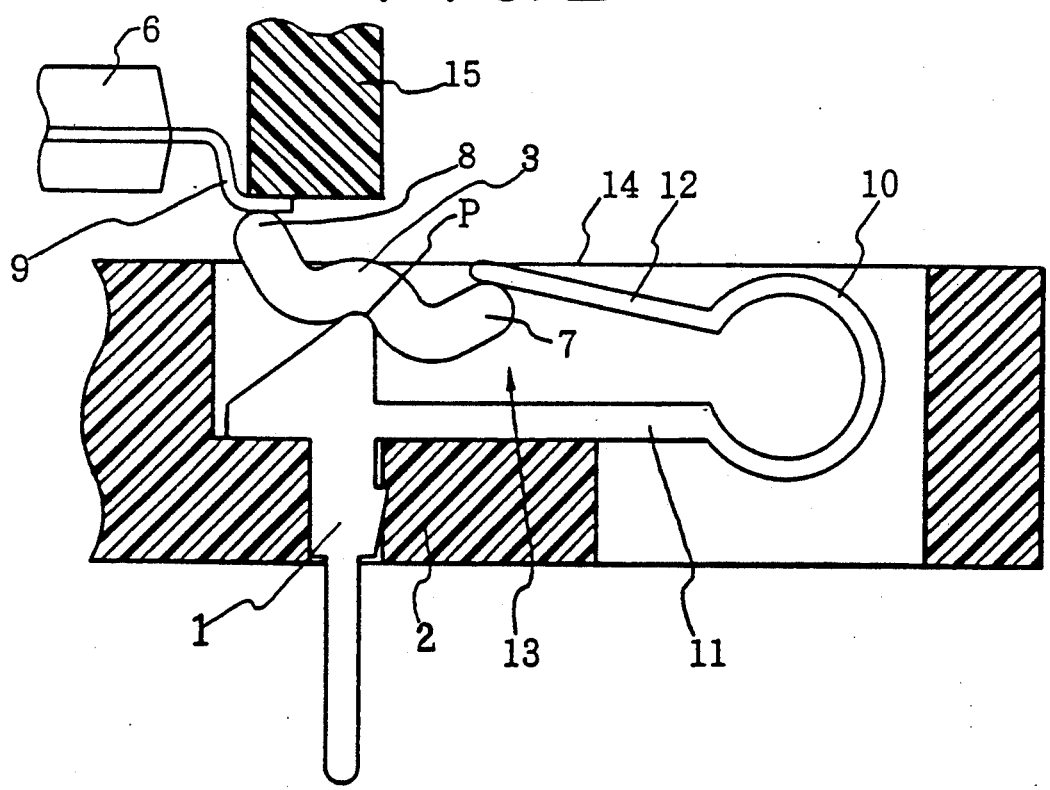
FIG. 2 is likewise a side sectional view of the above contact, but with a terminal of an electric part mounted thereon to realize a contact relation.

FIRST EMBODIMENT (FIGS. 1 and 2)

The numeral 1 denotes a stationary terminal. The stationary terminal 1 is implanted in a socket board 2 formed from an insulating material, and a lower end of the stationary terminal 1 is designed to extend downward so as to be connected to a wiring board, etc. The numeral 3 denotes a swinging contact element formed of a rigid body. An intermediate portion of the swinging contact element 3 is supported by an upper end of the stationary terminal 1, and therefore, the swinging contact element 3 is swingable about the supporting portion as its fulcrum P. The swinging contact element 3 is provided at an intermediate portion thereof with a recess portion 4, while the stationary terminal 1 is provided at an upper end thereof with a protruded portion 5. By inserting the protruded portion 5 into the recess portion 4, the swinging contact element 3 is supported by the stationary terminal 1 and swung about the fulcrum P while maintaining a relative position with respect to the stationary terminal 1.

The swinging contact element 3 is supported by the upper end of the stationary terminal 1 and swingable about the fulcrum P. One swinging end 7 of the swinging contact element 3 is resiliently held in one swinging direction by a spring 10 extending from the stationary terminal 1, and the other swinging end 8 serves as a contact end with respect to a terminal 9 of an electric part 6.

The spring 10 comprises a basal portion 11 generally horizontally extending backward from the upper end portion of the stationary terminal 1 projecting toward an upper surface side of the insulating board 2, and a spring portion 12 bent forwardly from the basal portion 11 and extending in parallel relation above the basal portion 11. A free end of the spring portion 12 resiliently holds one swinging end 7 of the swinging contact element 3 in one swinging direction.

The socket board 2 is provided in an upper surface side thereof with a number of slits 13, and the stationary terminal 1 is implanted in a bottom surface of each slit 13. The basal portion 11 is designed to extend from the upper end of the stationary terminal projecting within the slit 13 along the bottom surface of the slit 13, and the spring portion 12 is bent back within the slit 13. Similarly, the swinging contact element 3 is supported by the stationary terminal 1 within the slit 13, and the swinging end of the contact element 3 is resiliently held downward by the spring portion 12. That is, the swinging contact element 3 is resiliently held in one swinging direction by the spring 10. The swinging contact element 3 and spring 10 are swung or resiliently displaced while being restricted at side surfaces thereof by a partition wall of the slit 13.

As is shown in FIG. 1, the swinging contact element 3 is pushed down at one swinging end 7 thereof by the spring portion 12, and pushed up at the other swinging end thereof so as to standby for contacting the terminal 9 of the electric part 6. One swinging end 7 of the swinging contact element 3 is held between the free end of the spring portion 12 and the basal portion 11. That is, the spring 10 holds one swinging end 7 of the swinging contact element 3 in cooperation with the basal portion 11, and holds the other swinging end 7 in a higher position.

As is shown in FIG. 2, the terminal 9 of the electric part 6 is mounted on the swinging end 8 of the swinging contact element 3, and the swinging end 8 is vertically pushed down by a push-down member 15. As a result, the swinging contact element 3 which is a rigid body is swung in the opposite direction with respect to that of FIG. 1 against the spring portion 12, so that biasing force is accumulated in the spring portion 12.

That is, the swinging contact element 3 pushes up the spring portion 12 which resiliently holds one swinging end 7 by the function of a lever, and the swinging end 8 of the swinging contact element 3 is pressure contacted to the terminal 9 of the electric part 6 by reaction of this spring portion in accordance with the effect of the lever. The push-down member 15 is, for example, an acting end of a presser pad or robot provided on a presser cover to be closed with respect to the socket board 2.

Figure 3:
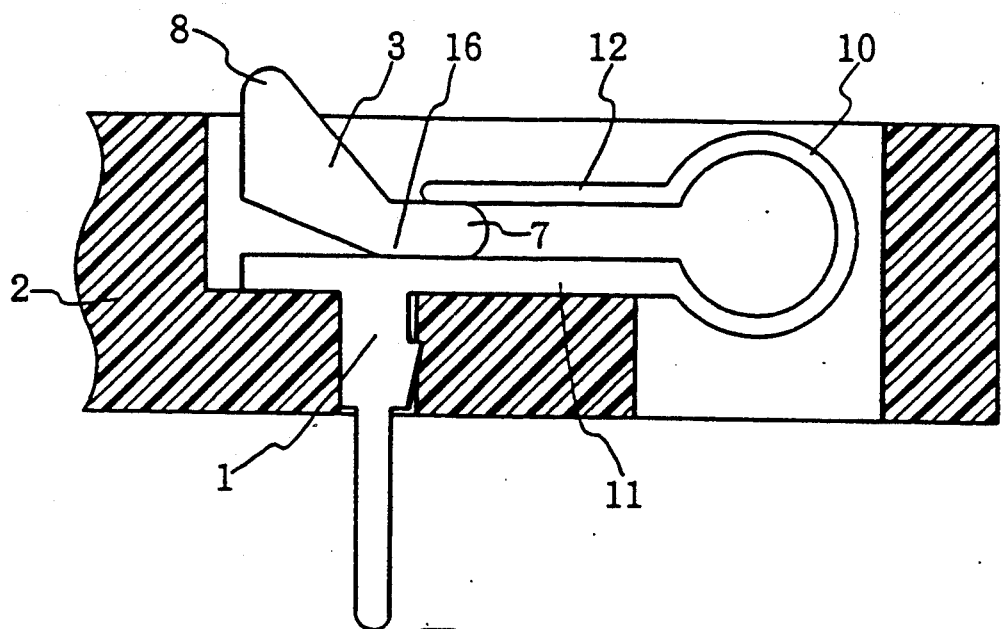
FIG. 3 is a side sectional view showing a mount-to-contact type contact according to a second embodiment of the present invention, which is implanted in a socket body.
Figure 4:
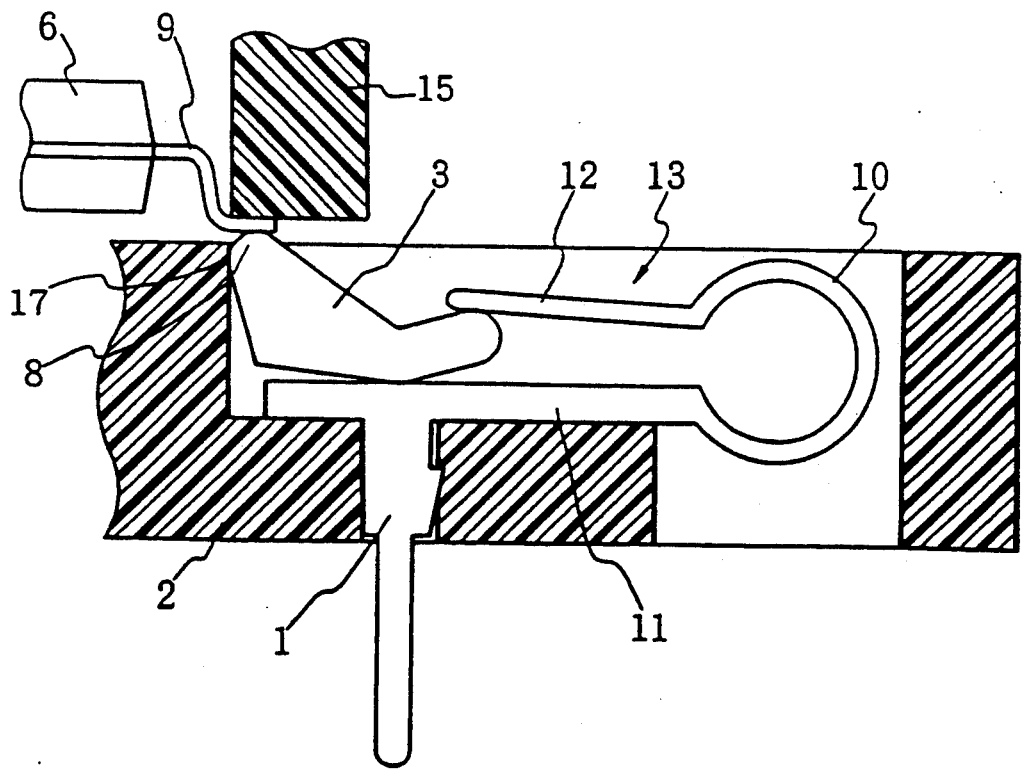
FIG. 4 is likewise a side sectional view of the above contact, but with a terminal of an electric part mounted thereon.

SECOND EMBODIMENT (FIGS. 3 and 4)

In this embodiment, an upper surface of the stationary terminal 1, i.e., the supporting surface of the swinging contact element 3 is planar, and the lower surface of the swinging contact element 3 is provided with a protruded portion 16, and the protruded portion 16 is supported by the upper surface of the swinging contact element 3 to form the swinging fulcrum P. Although not shown, it may be designed such that the protruded portion 16 is fitted in a recess portion formed on the upper surface of the stationary terminal 1 to form a swinging fulcrum.

FIG. 3 shows a standby state, in which one swinging end 7 of the swinging contact element 3 is pushed down by the spring portion 12, and the other swinging end 8 is pushed up so as to be ready to contact the terminal 9 of the electric part 6. FIG. 4 shows a state, in which the terminal 9 of the electric part 6 is mounted on the swinging end 8, the swinging end 8 is pushed down by the push-down member 15, the spring portion 12 is pushed up by the swinging end 7 to accumulate biasing force, and a pressure contact with respect to the terminal 9 of the electric part 6 is obtained by reaction thereof. When the swinging end 8 of the swinging contact element 3 is pushed down by the push-down member 15, the swinging end 8 can be brought into abutment against an end wall 17 of the slit 13 to form a swinging dead point. The same is true of the first embodiment.

THIRD EMBODIMENT (FIGS. 5 AND 6)

In the first and second embodiments, the spring 10 extends from the upper end of the stationary terminal 1. In this third embodiment, the spring 10 is formed as a separate body with respect to both the stationary terminal 1 and swinging contact element 3, and the basal portion 11 of the spring 10 is implanted and fixed to a wall defining the slit 13, that is, for example, one end portion of a bottom wall of the slit 13, such that one swinging end of the swinging contact element 3 is resiliently held in one swinging direction by the free end of the spring 10.

Figure 5:
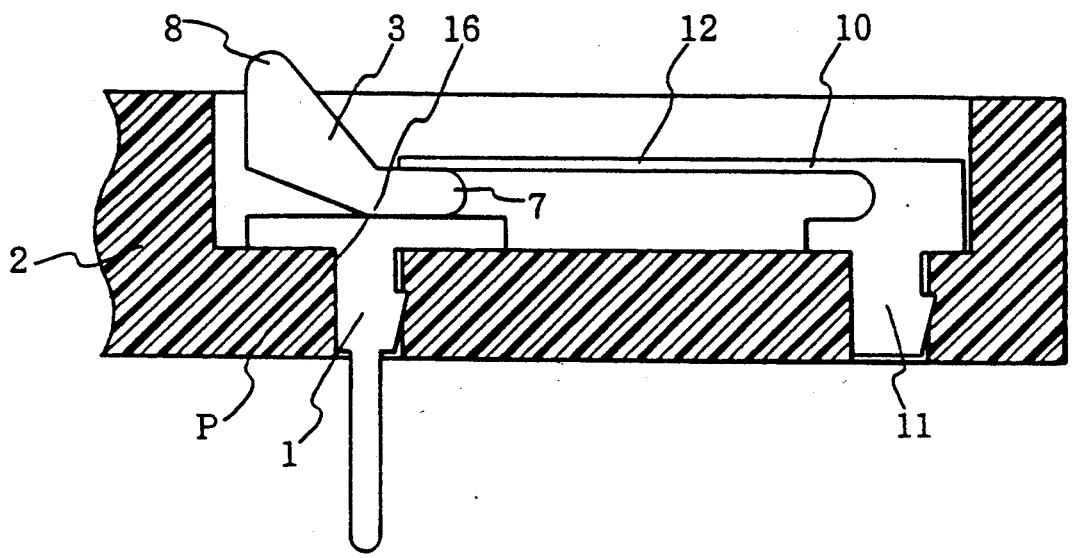
FIG. 5 is a side sectional view showing a mount-to-contact type contact according to a third embodiment of the present invention, which is implanted in a socket body.
Figure 6:
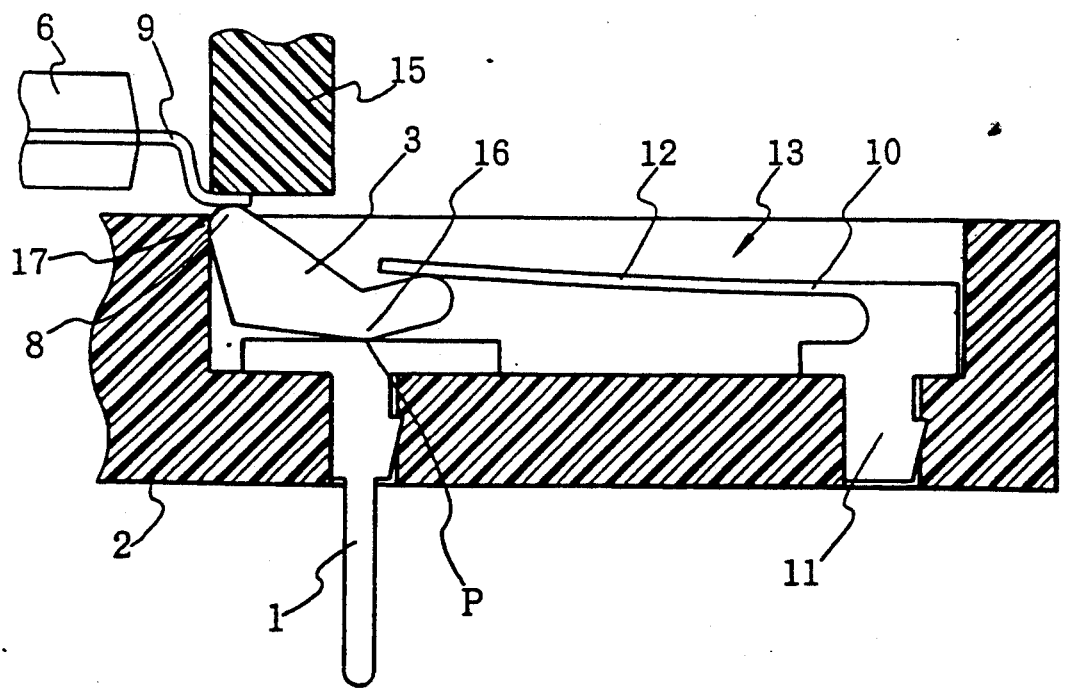
FIG. 6 is likewise a side sectional view of the above contact, but with a terminal of an electric part mounted thereon.

FIG. 5 shows a standby state ready to contact the electric part, and FIG. 6 shows a contact state. Operation is the same as in the first and second embodiments. The spring 10 can be formed as a separate body also in the first, second and third embodiments.

Figure 7:
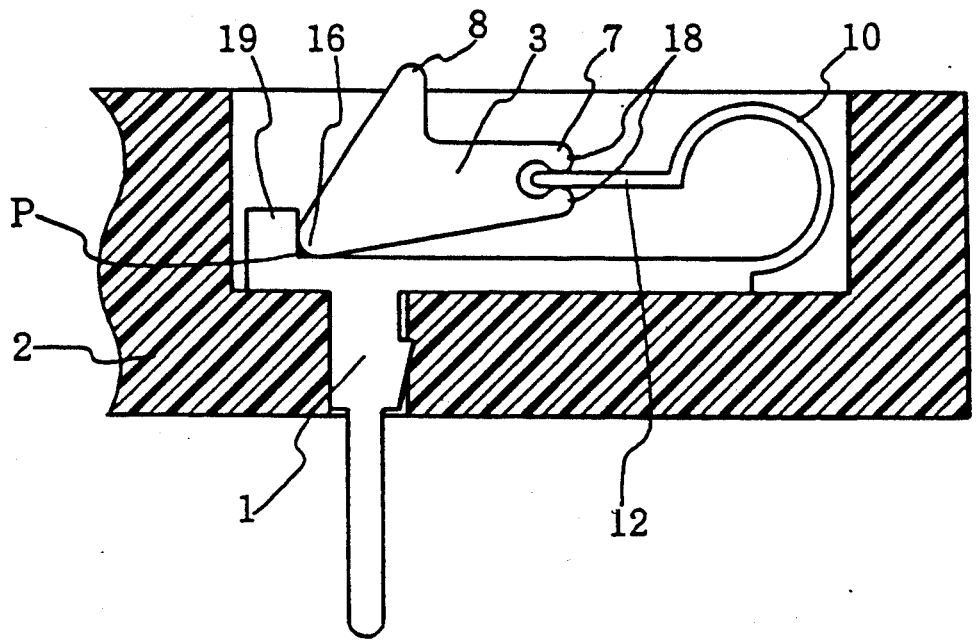
FIG. 7 is a side sectional view showing a mount-to-contact type contact according to a fourth embodiment of the present invention, which is implanted in a socket body.
Figure 8:
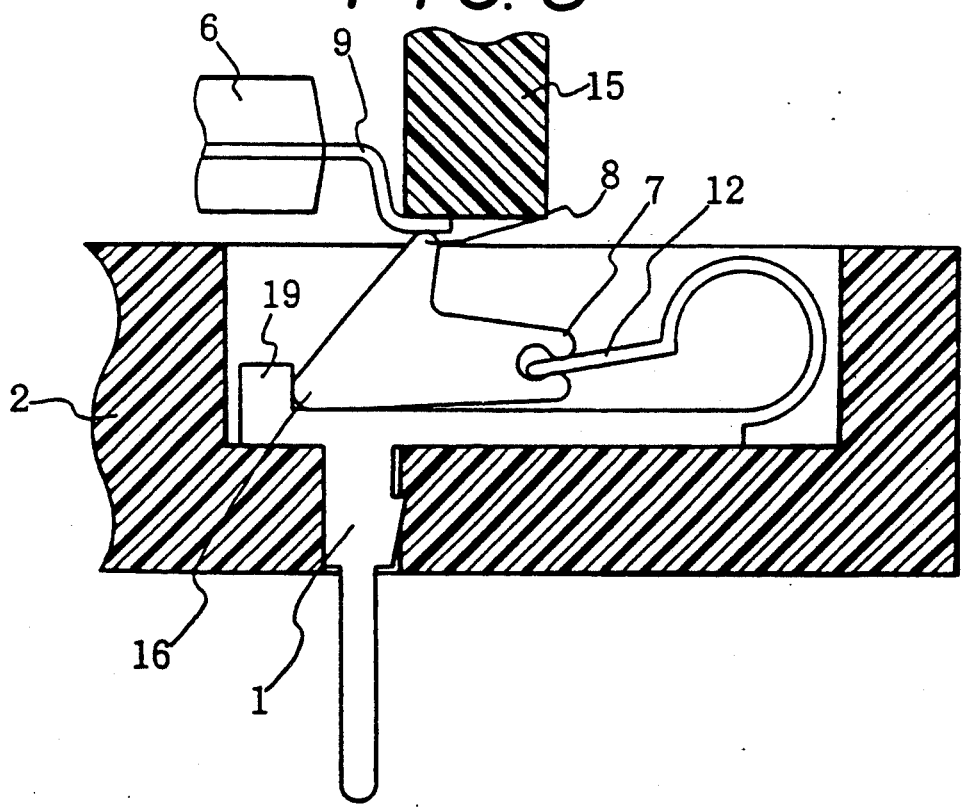
FIG. 8 is likewise a side sectional view of the above contact, but with a terminal of an electric part mounted thereon.

FOURTH EMBODIMENT (FIGS. 7 and 8)

In the first through third embodiments, contact pressure on the terminal 9 of the electric part 6 is obtained by pushing up the spring portion 12 by the swinging contact element 3. On the other hand, in the embodiment shown in FIGS. 7 and 8, there is shown a state in which contact pressure to the terminal 9 of the electric part 6 is obtained by pushing down the spring portion 12. Therefore, as is shown in FIG. 7, the spring portion 12 holds the swinging contact element 3 in such a manner as to push up one swinging end 7 of the swinging contact element 3.

For example, one swinging end 7 of the swinging contact element 3 is provided, as illustrated, with a clip 18, and the free end of the spring portion 12 is clipped by this clip 18 so that the swinging contact element 3 will follow the movement of the spring portion 12. Although not shown, by supporting one swinging end 7 of the swinging contact element 3 on the upper surface of the spring portion 12, upward force can be exerted on the swinging end 7.

In the first through third embodiments, one swinging end 7 and the other swinging end 8 of the swinging contact element 3 extend from the fulcrum P in opposite directions from each other. In the fourth embodiment, both the swinging ends 7, 8 extend from the fulcrum P in generally the same direction. The protruded portion 16 of the swinging contact element 3 forming the fulcrum P, i.e., the protruded portion 16 formed in an area of connection between the swinging ends 7 and 8 is supported by the recess portion or angular portion formed on the upper end of the stationary end 1 so that the swinging contact element 3 will be correctly positioned. That is, as one example, a displacement stopper 19 projects from an upper end face of the stationary terminal 1, and the protruded portion 16 of the swinging contact element 3 is engaged with an inner side of the displacement stopper 19, so that displacement is prevented when the swinging contact element 3 swings, thus ensuring a constant swinging.

As is shown in FIG. 7, the spring portion 12 pushes up one swinging end 7 of the swinging contact element 3 and pushes up the other swinging end 8 so that the swinging contact element 3 will standby for contacting the terminal 9 of the electric part 6. As is shown in FIG. 8, the terminal 9 of the electric part 6 is mounted on the swinging end 8 of the swinging contact element 3 and the swinging contact element 3 is pushed down by the push-down member 15. As a result, the swinging contact element 3 pushes down the spring portion 12 against resiliency thereof, and the swinging end 8 is pressure contacted with the terminal 9 of the electric part 6 by reaction thereof.

According to the present invention, in the standby states of the first through fourth embodiments shown in FIGS. 1, 3, 5 and 7, the spring portion 12 can be held in a state where resilient force is exerted to one swinging end 7 of the swinging contact element 3 or no resilient force is exerted thereon. That is, when the spring portion 12 is displaced into the states shown in FIGS. 2, 4, 6 and 8, resilient force is exerted to the swinging end 7 of the swinging contact element 3.

Furthermore, the present invention also includes a modification in which, when the swinging contact element 3 is swingably supported by the stationary terminal 1, the swinging contact element 3 is supported by the neighborhood of the upper end of the stationary terminal 1, as in the example, in which the swinging contact element 3 is supported by an extended portion from the upper end of the stationary terminal 1.

According to the present invention, a signal path is formed between the swinging end of the swinging contact element on which the electric part is to be mounted to realize a contact relation and the fulcrum, thus shortening the path length. Further, since the terminal of the electric part is mounted on the swinging end of the swinging contact element to displace the spring, operation for displacing the spring can be performed with a reduced operating force. On the contrary, a sufficient contact pressure to the terminal of the electric part can be obtained by a limited spring force in accordance with the lever effect of the swinging contact element.

Furthermore, while obtaining the above-mentioned effects, reliable contact between the terminal of the electric part and the contact can be ensured as in the conventional example in which the terminal of the electric part is mounted on the free end of the horizontal U-shaped spring portion. No positional displacement of contact takes place as in, for example, the horizontal U-shaped spring portion displaced to contact the stationary terminal.

What is claimed is:

1. A mount-to-contact type contact comprising a stationary terminal, a swinging contact element swingably supported by said stationary terminal, and a spring adapted to resiliently hold on swinging end of said swinging contact element in a swinging direction, the other swinging end serving as a contact end on which a terminal of an electric part is to be mounted to realize a contact relation, said contact end formed by said other swinging end being swung in a swinging direction to swing said one swinging end against said spring so that contact pressure with said terminal of said electric part mounted on said contact end can be obtained by reaction of said spring portion.

2. A mount-to-contact type contact comprising a stationary terminal, a swinging contact element swingably supported by said stationary terminal, and a spring adapted to resiliently hold one swinging end of said swinging contact element in a swinging direction, the other swinging end serving as a contact end on which a terminal of an electric part is to be mounted to realize a contact relation, said contact end formed by said other swinging end being swung in a swinging direction to swing said one swinging end against said spring so that contact pressure with said terminal of said electric part mounted on said contact end can be obtained by reaction of said spring portion.

3. A mount-to-contact type contact as claimed in claim 1 or 2, wherein said swinging contact element is a rigid body.

4. A mount-to-contact type contact as claimed in claim 1 or 2, wherein a protruded portion formed on an upper end of said stationary terminal is supported in a recess portion formed in said swinging contact element, to thereby form a swinging fulcrum.

5. A mount-to-contact type contact as claimed in claim 1 or 2, wherein a protruded portion formed on said swinging contact element is supported on a planar portion formed on an upper end of said stationary terminal, to thereby form a swinging fulcrum.

* * * * *